United States Patent
Garney

(10) Patent No.: US 7,412,562 B2
(45) Date of Patent: Aug. 12, 2008

(54) USING NON-VOLATILE MEMORIES FOR DISK CACHING OF PARTITION TABLE ENTRIES

(75) Inventor: John I. Garney, Portland, OR (US)

(73) Assignee: Intel Corporation, Santa Clara, CA (US)

(*) Notice: Subject to any disclaimer, the term of this patent is extended or adjusted under 35 U.S.C. 154(b) by 106 days.

(21) Appl. No.: 11/251,665

(22) Filed: Oct. 17, 2005

(65) Prior Publication Data

US 2006/0036806 A1 Feb. 16, 2006

Related U.S. Application Data

(62) Division of application No. 10/287,115, filed on Nov. 4, 2002, now abandoned.

(51) Int. Cl.
*G06F 12/00* (2006.01)

(52) U.S. Cl. .................................... 711/113; 711/163
(58) Field of Classification Search ................ 711/113
See application file for complete search history.

(56) References Cited

U.S. PATENT DOCUMENTS

| 5,586,291 A * | 12/1996 | Lasker et al. ................ 711/113 |
| 5,936,832 A * | 8/1999 | Saito et al. ................ 361/321.4 |
| 2003/0070083 A1* | 4/2003 | Nessler ........................ 713/193 |

* cited by examiner

*Primary Examiner*—Donald Sparks
*Assistant Examiner*—Jesse Diller
(74) *Attorney, Agent, or Firm*—Trop, Pruner & Hu, P.C.

(57) ABSTRACT

A disk cache may include a volatile memory such as a dynamic random access memory and a nonvolatile memory such as a polymer memory. When a cache line needs to be allocated on a write, the polymer memory may be allocated and when a cache line needs to be allocated on a read, the volatile memory may be allocated.

8 Claims, 3 Drawing Sheets

USING NON-VOLATILE MEMORIES FOR DISK CACHING OF PARTITION TABLE ENTRIES

CROSS-REFERENCE TO RELATED APPLICATIONS

This application is a divisional of U.S. patent application Ser. No. 10/287,115, filed on Nov. 4, 2002 now abandoned.

BACKGROUND

This invention relates generally to disk caching for processor-based systems.

Input/output devices, such as disk drives used with processor-based systems, may be slower than other circuitry in those processor-based systems including the central processing units and/or memory devices. Therefore, there have been many attempts to increase the performance of input/output devices. However, because such devices are electromechanical in nature, there is a finite limit beyond which performance cannot be increased.

One way to reduce the information bottleneck at input/output devices, such as disk drives, is to use a cache. A cache is a memory device that logically resides between a device and the remainder of the processor-based system such as one or more central processing units and/or computer busses. A cache is an area memory that serves as a temporary storage area for the device, such as the disk drive. Frequently accessed data resides in the cache after initial access and subsequent accesses to the same data may be made to the cache instead of the device. The cache for a disk drive generally resides in the computer main memory, but may also reside in a separate device coupled to the system bus, as another example.

Typically, disk caches that use volatile memory, such as dynamic random access memory (DRAM) cannot save written data due to reliability concerns. If power is lost, there may be data corruption if that data is only stored in volatile memory. Disk caches that use nonvolatile memory, such as Flash memory or battery-backed up dynamic random access memory, may be more expensive.

Thus, there is a need for a disk cache that overcomes the problems inherent in existing volatile and nonvolatile memories.

DETAILED DESCRIPTION

Figure 1:
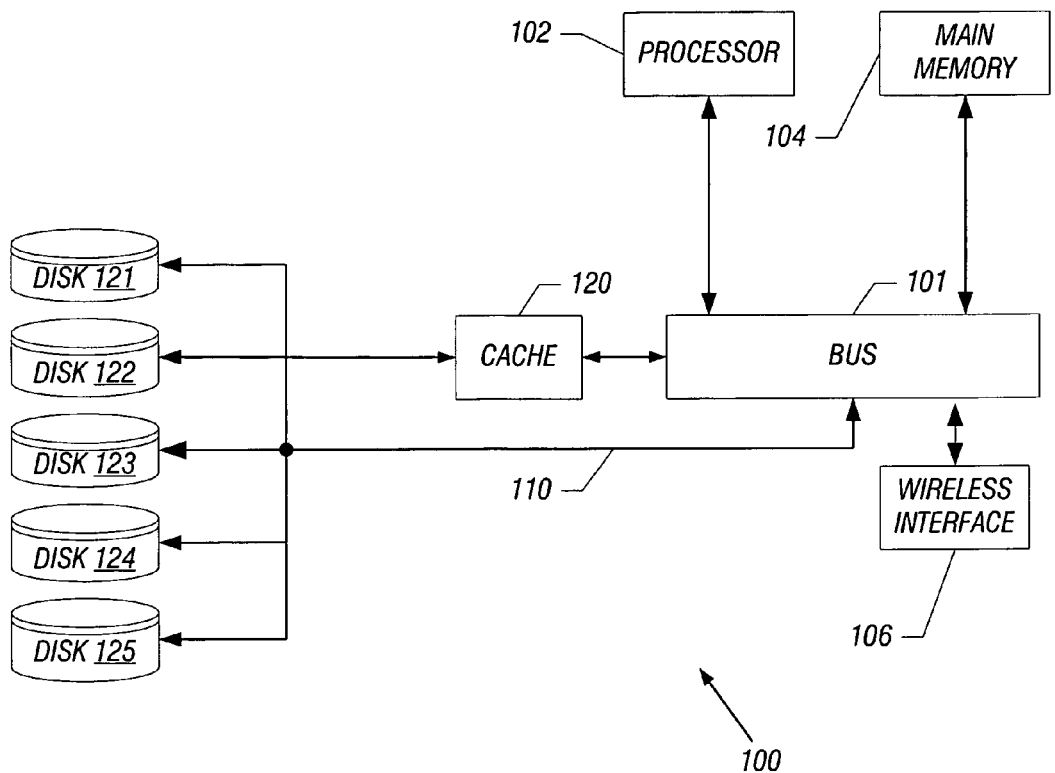
FIG. 1 is a block diagram of a system in accordance with one embodiment of the present invention.

Referring to FIG. 1, the processor-based system 100 may be a desktop computer, a laptop computer, a server, or any of a variety of other processor-based systems. In one embodiment, the system may enable wireless network access using a wireless interface 106. The wireless interface 106 may be a radio frequency interface, as one example, including a transceiver and an antenna. For example, the wireless interface may enable access to a server or a client on a client server system over a suitable wireless medium, such as a radio frequency medium. However, the present invention is not limited to processor-based systems that permit wireless access.

The system 100 may include one or more disk drives, such as the drives 121-125. A bus 101 communicates information between the processor 102 and devices such as the main memory 104 and the disk drives 121-125. The disk drives 121-125 may be accessible via lines 110 coupled to the bus 101 or, alternatively, through the cache 120.

If a particular datum in one of the disks 120-125 is accessed that was read on a previous access, that location may reside in the cache 120. The datum may be in the cache 120 unless it has been replaced using the system's cache replacement or coherency algorithm. In the case of a cache hit (the data resides in the cache), the data may be retrieved directly from the cache 120. In the case of a cache miss (the data is not contained in the cache 120), the information may be retrieved directly from the drive 121-125 over the lines 110 via the bus 101. The data may be made available to the processor 102 or, as another example, loaded into main memory 104 in a direct memory access (DMA) system. In the event of a cache miss, the data may be placed into the cache 120 for later accesses.

Write operations may be treated differently than read operations. Data may be written to the cache 120 using the write through or store through cache replacement algorithm or the write back or copy back or storing cache replacement algorithm. In the write through replacement algorithm, every time a write is made, the information is written to the cache and a simultaneous request is made on the bus 101 to write the data to the fixed media devices. Cache contents remain consistent with the contents of the disk drives 121-125.

In a write back cache replacement algorithm, the information is written only to the cache 120. The processor-based system 10 writes the cache block to the device, such as a disk drive 121-125, only when the cache block is replaced with a cache block for some other disk location. In the write back caching system, the cache contents are considered dirty when they are inconsistent with the contents of the fixed media devices, such as the drives 121-125. If the cache contents are replaced with a cache block for some other disk location and a disk 121-125 has not yet been updated from the cache 120, then the cache block is flagged as dirty, indicating that it needs to be written to a disk 121-125. An area, known as a cache tag, is typically reserved in the cache 120 to store information indicating whether blocks stored in the cache are clean or dirty.

If a block is dirty, then the location is flagged using a status bit. The dirty block is written back to a disk 121-125 at a time when the cache 120 is idle or when modified cache contents are to be replaced by new data from a different disk location. After writing the data back to a disk 121-125, the dirty status bit is cleared.

Under normal operating circumstances, a write back cache substantially increases performance as disk operations are performed only when necessary. However, if the system power is lost while data contained in the cache is dirty, the device will not be updated with current data. This may result in corruption of files stored on the disk, because certain allocation tables or other file linkage information stored on the device may not be complete prior to the system power loss.

Also, data contained within the cache 120 could be irretrievably lost. A loss of power while a cache contains dirty data is, therefore, a serious problem if the write back cache only contains volatile memory.

Figure 2:
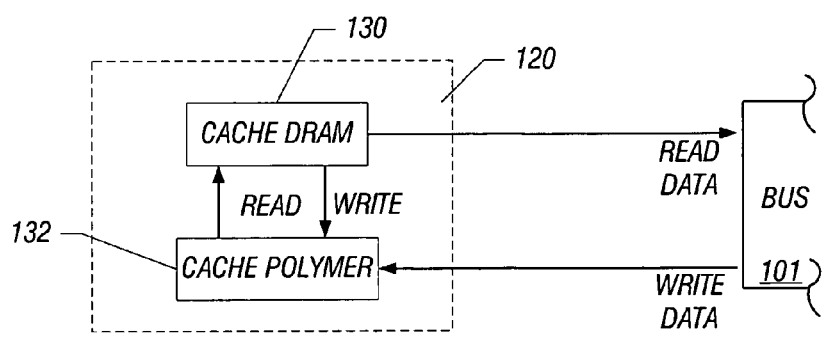
FIG. 2 is a block diagram of the disk cache in accordance with one embodiment of the present invention.

Referring to FIG. 2, the cache 120 is shown in more detail. The cache 120 may include a volatile memory cache 130, such as a dynamic random access memory (DRAM) coupled to a polymer memory cache 132. The polymer memory cache 132 involves polymer chains with dipole moments. Data may be stored by changing the polarization of a polymer between conductive lines. For example, a polymeric film may be coated with a large number of conductive lines. A memory located at a cross point of two lines is selected when the two transverse lines are both charged. Because of this characteristic, polymer memories are also sometimes referred to as a cross point memories.

Polymer memories may be advantageous since no transistors may be needed in some cases to store each bit of data and the polymer layers can be expanded to a large number of layers, increasing the memory capacity. In addition, the polymer memory is nonvolatile and has relatively fast read and write speeds. The polymer memory also has relatively low costs per bit and lower power consumption. Thus, the polymer memory has a combination of low costs and high capacity.

Some polymers that exhibit ferromagnetism may be used to form polymer memories. One such polymer is poly vinylidene fluoride (PVDF, whose repeat formula is (CH2-CF2)n) and some of its copolymers. Various polymers may be used to form the polymer memory structures, whether crystalline or spin-on. In one embodiment the polymer memory is made from a ferroelectric polymer selected from polyvinyl and polyethylene fluorides, copolymers thereof, and combinations thereof. In another embodiment the polymer memory is made from a ferroelectric polymer selected from polyvinyl and polyethylene chlorides, copolymers thereof, and combinations thereof. In another embodiment the polymer memory is made from a ferroelectric polymer selected from polyacrylonitriles, copolymers thereof, and combinations thereof. In another embodiment the polymer memory is made from a ferroelectric polymer selected from polyamides, copolymers thereof, and combinations thereof. Other embodiments may include combinations of the above that cross different types such as polyfluorides and polyamides or polyfluorides and polyacrylonitriles.

Because a cache composed only of volatile memory cannot typically save written data due to the reliability concerns discussed previously, the cache 120 that may function as a write back cache, may include both a volatile cache 130 and a polymer cache 132. The polymer cache 132 may be slower than the volatile cache 130 since DRAM access times are typically much faster than those expected for polymer memories.

However, the polymer memory cache 132 may have slower read/access times than the volatile memory cache 130. Thus, placing read data in the volatile memory cache 130 provides for the fastest read access times. Placing frequently written data in the polymer memory cache 132 provides performance improvements compared to disk access times, while ensuring that the data remains nonvolatile and restorable, for example, in the event of a power loss.

Thus, as indicated in FIG. 2, read data may be accessed from the volatile memory cache 130 and write data may be written to the polymer memory cache 132. Data may then be exchanged between the caches 130 and 132 under specific circumstances.

Figure 3:
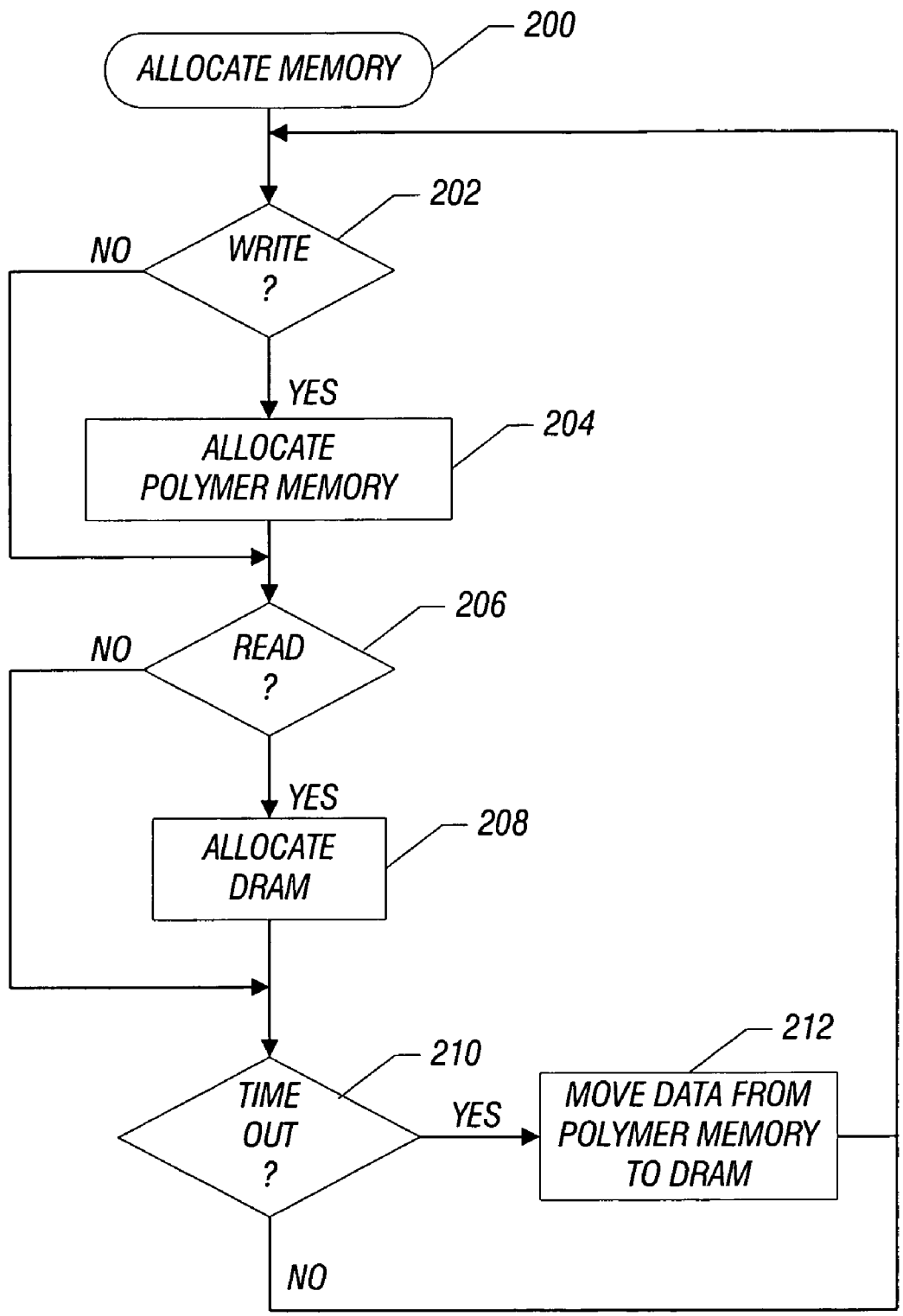
FIG. 3 is a flow chart in accordance with one embodiment of the present invention.

Referring to FIG. 3, the memory allocation system 200 may be implemented in hardware or software. In the case of a software implementation, the software may be stored on one of the disks 121-125, on a semiconductor memory, or the main memory 104, as well within the cache 120, to mention a few examples.

If a cache line needs to be allocated on a write, as determined at diamond 202, it may be allocated to polymer memory cache 132, as indicated in block 204. Conversely, when a cache line needs to be allocated on a read, as determined in diamond 206, it may be allocated to the volatile memory cache 130, as indicated in block 208. If, after a predetermined time, determined at diamond 210, data written in the polymer memory cache 132 still remains, it may be moved to a disk 121-125 if it is otherwise unaccessed. Also, data written to a cache line in the volatile memory cache 130 may cause a cache line to be moved to the polymer memory cache 132. Similarly, a cache line read from the polymer memory cache 132 may be moved to the volatile memory cache 130.

Thus, using the memory allocation scheme and both volatile and nonvolatile memory in the form of a polymer memory, it is possible to have both the advantages of volatile and nonvolatile memories in a disk cache. That is, with respect to writes, reliability may be preserved and, with respect to reads, speed may be attained.

In a processor-based system having an add-in card with a write back, non-volatile disk cache, once caching is enabled, if the user moves a disk into another processor-based system without disabling the cache, some of the disk's data may only be resident in the cache so that the disk state is no longer coherent. If the disk can be used in another system, incorrect computations may result due to incoherent disk data. Thus, it would be desirable to prevent the disk from being used if it is separated from the cache.

When caching is enabled, a partition table of the cache disk is saved in the cache and a disk resident copy is scrambled. The scrambling may be done by simply changing the partition type of the disk partitions being cached to some atypical value. Then, future accesses to the partition of the table are redirected to the cache and the cached, unscrambled copy as long as the cache is being used in the system. The redirection to the cached copy may be under control of an operating system specific disk driver or a read only memory (ROM) basic input/output system (BIOS), as two examples, which may be stored in main memory 104 or on a disk drive 121-125 in the system 100 of FIG. 1, where the cache 120 is used as the cache 146.

When caching is disabled, the saved partition table copy may be restored to the disk. While caching is enabled, if the disk drive is removed and relocated to another system without its cache, that system may discover a disk with an unknown or invalid partition. The data on the partition may not be accessible until the drive is returned to the system with the cache having the appropriate partition table copy.

If only the partition type is changed, the partition type may be manually changed back to a known value for emergency recovery attempts of the state of the disk, for example, in the case of a cache hardware failure. Also, a reformat of the disk would allow the drive to be reused with a loss of all the data on the partition without affecting other partitions.

Thus, users are protected from doing damage to their data when they move a disk from one system to another, while giving users the full benefits of high performance disk caches, in some embodiments. This feature may be provided, in some embodiments, transparently to the end user.

Figure 4:
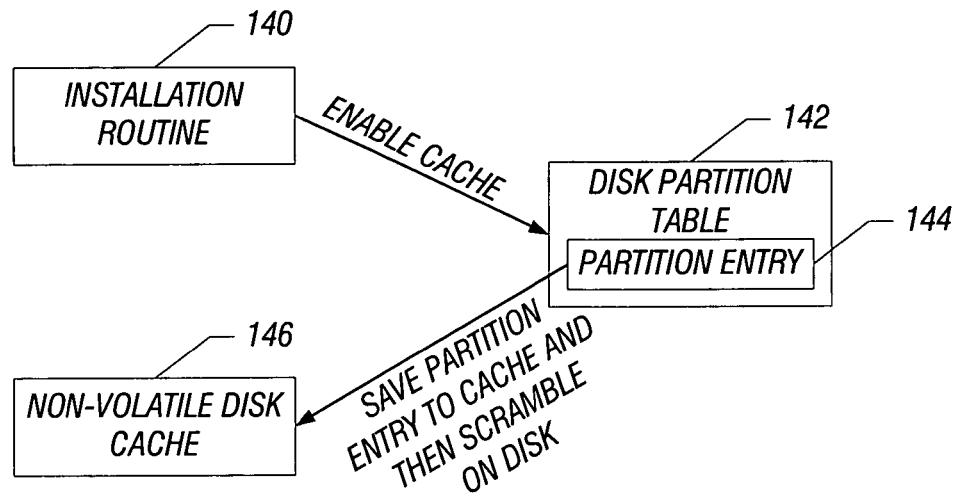
FIG. 4 is a schematic depiction of another embodiment of the present invention.

Thus, referring to FIG. 4, an installation routine 140 enables the disk cache when caching is enabled. In a disk partition table 142, a partition entry 144 may be saved to a cache 146 and then scrambled on the disk.

Then future accesses to the partition table 142 are simply redirected to the unscrambled copy of the partition table 142 on the cache 146 as long as the cache is correctly being used in the system. When caching is then disabled, the partition table 142 may be restored back to the disk. Then, if the disk drive is removed and relocated without the cache, the system will discover a disk with an unknown or invalid partition and so the data on the disk will not be accessible. This prevents moving the disk inappropriately from system to system.

Figure 5:
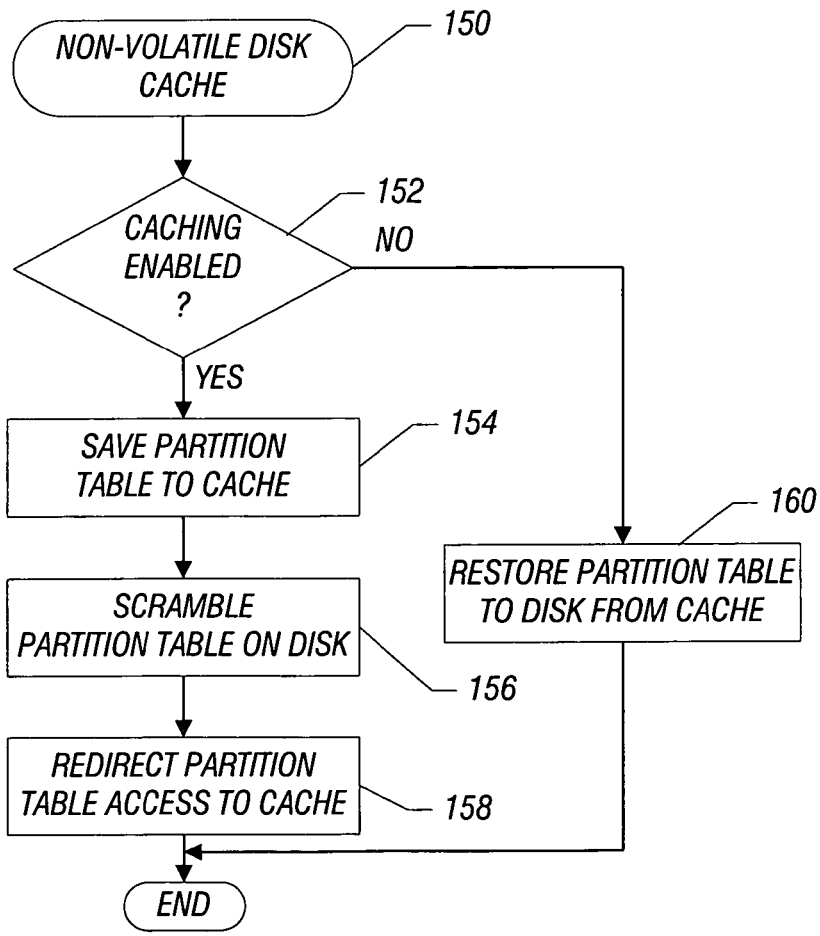
FIG. 5 is a flow chart for one embodiment of the present invention.

Referring to FIG. 5, a non-volatile disk cache software 150 may be resident in operating specific device driver or a BIOS, as two examples. A check at diamond 152 determines whether caching is enabled. If not, the partition table is restored to the disk from the cache as indicated in block 160.

When caching is enabled, the partition table is saved to the non-volatile disk cache as indicated in block 154. The partition table on the disk is scrambled as indicated in block 156. Any partition table access is redirected to the cache as indicated in block 158 as long as caching is enabled.

Modification of the partition table, while still providing transparent access via the non-volatile cache, is a cost effective way of handling the issue of disks moving from system to system in some embodiments.

The cache 146 need not include a volatile and a non-volatile cache as was the case for the cache 120. However, in one embodiment, the cache 146 may be implemented by the cache 120 in the system 100 shown in FIG. 1.

In some memory storage technologies, an operation to read data from a memory location causes the data to be destroyed. This is often called a destructive read operation and may result from the type of storage media used or how the memory system is designed. Some nonvolatile memory storage devices, for example, have destructive read operations. Destruction of the data in a particular memory location may include erasing, clearing, resetting, and/or overwriting the memory location. In such memory devices, the data read must typically be written back after being read in order to behave in a nondestructive read memory device manner.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    saving a partition table entry from a disk to a disk cache in a first system;
    scrambling the entry on the disk in such a way that if the disk is removed from a first system and used in a second system without the cache the entry cannot be accessed, but when the disk is returned to the first system the entry can be accessed;
    restoring said entry to the disk from the cache; and
    determining whether disk caching is disabled and, if so, restoring said entry to the disk.

2. The method of claim 1 including redirecting an access to said entry on said disk to said cache.

3. An article comprising a computer readable medium storing instructions that enable a first processor-based system to:
    save a partition table entry from a disk to a disk cache;
    scramble the entry on the disk in such a way that if the disk is removed from the first system and used in a second system without the cache the entry cannot be accessed, but when the disk is returned to the first system the entry can be accessed;
    restore said entry to the disk from the cache; and
    determine whether disk caching is disabled and, if so, to restore said entry to said disk.

4. The article of claim 3 further storing instructions to redirect an access to said entry on said disk to said disk cache.

5. A system comprising:
    a processor;
    a disk cache coupled to said processor;
    a storage coupled to said processor storing instructions that enable the system to save a partition table entry from a disk to the disk cache and scramble the entry on the disk in such a way that if the disk is removed from the system and used in a second system without the cache the entry cannot be accessed, but when the disk is returned to the system the entry can be accessed, said storage to restore said entry to the disk from the cache, and wherein said storage stores instructions to determine whether disk caching is disabled and, if so, to restore said entry to said disk; and
    a wireless interface.

6. The system of claim 5 including a disk drive.

7. The system of claim 5 wherein said cache includes a polymer memory.

8. The system of claim 5 wherein said storage stores instructions to redirect an access to said entry on said disk to said disk cache.

* * * * *